(12) United States Patent
Daniels

(10) Patent No.: US 7,140,190 B2
(45) Date of Patent: Nov. 28, 2006

(54) REFRIGERATOR AND NECK TUBE ARRANGEMENT FOR CRYOSTATIC VESSEL

(75) Inventor: Peter Derek Daniels, Daventry (GB)

(73) Assignee: Oxford Magnet Technology Ltd., Eynsham/Oxford (GB)

( * ) Notice: Subject to any disclaimer, the term of this patent is extended or adjusted under 35 U.S.C. 154(b) by 425 days.

(21) Appl. No.: 10/715,825

(22) Filed: Nov. 19, 2003

(65) Prior Publication Data

US 2004/0194473 A1    Oct. 7, 2004

(30) Foreign Application Priority Data

Nov. 20, 2002  (GB)  ................... 0227067.6

(51) Int. Cl.
*F25B 9/00*       (2006.01)
*F25B 19/00*      (2006.01)
*F17C 5/02*       (2006.01)

(52) U.S. Cl. ............... 62/6; 62/51.1; 62/47.1

(58) Field of Classification Search .......... 62/6, 62/51.1, 47.1
See application file for complete search history.

(56) References Cited

U.S. PATENT DOCUMENTS 4,223,540 A *  9/1980  Longsworth .............. 62/51.1
5,251,456 A * 10/1993  Nagao et al. ............. 62/259.2
5,365,743 A * 11/1994  Nagao et al. ............. 62/47.1
5,744,959 A *  4/1998  Jeker et al. ............... 324/319
5,918,470 A *  7/1999  Xu et al. .................. 62/51.1
6,192,690 B1* 2/2001  Stautner ..................... 62/6
6,490,871 B1* 12/2002 Stautner .................... 62/51.1

FOREIGN PATENT DOCUMENTS

WO   WO 03012803 A3   2/2003

* cited by examiner

*Primary Examiner*—William C. Doerrler
(74) *Attorney, Agent, or Firm*—Crowell & Moring LLP

(57) ABSTRACT

A cryogenic chamber comprising an outer vacuum vessel (9), an inner cryogen vessel (11), a turret (40) housing a neck tube (8) itself providing external access to the inner cryogen vessel (11), and a pulse tube refrigerator (20) itself comprising at least one pulse tube and at least one regenerator tube. The pulse tube refrigerator is located within a vacuum contained between the outer vacuum vessel (9) and the inner cryogen vessel (11) and the pulse tube refrigerator (20) and the neck tube (8) share a single turret (40). The cooling stage(s) (6, 7) of the pulse tube refrigerator (20) is/are rigidly mechanically connected to the neck tube (8) by highly conductive thermal links. The pulse tube(s) and regenerator tube(s) are displaced away from the neck tube and from each other.

18 Claims, 2 Drawing Sheets

Prior Art

REFRIGERATOR AND NECK TUBE ARRANGEMENT FOR CRYOSTATIC VESSEL

The present invention relates to refrigeration devices used to cool cryogenic vessels, such as helium vessels used to maintain superconducting electromagnets at cryogenic temperatures. In particular, the invention relates to an arrangement for the installation of a pulse tube refrigerator and a neck tube within a cryogenic vessel. U.S. Pat. No. 5,711,157 and the corresponding UK patent GB2318176 disclose a refrigerator cooling system comprising a pulse tube refrigerator. These documents do not relate to the integration of cooling of a neck tube. European patent EP 0260036 discloses a cryostat assembly.

Figure 1:
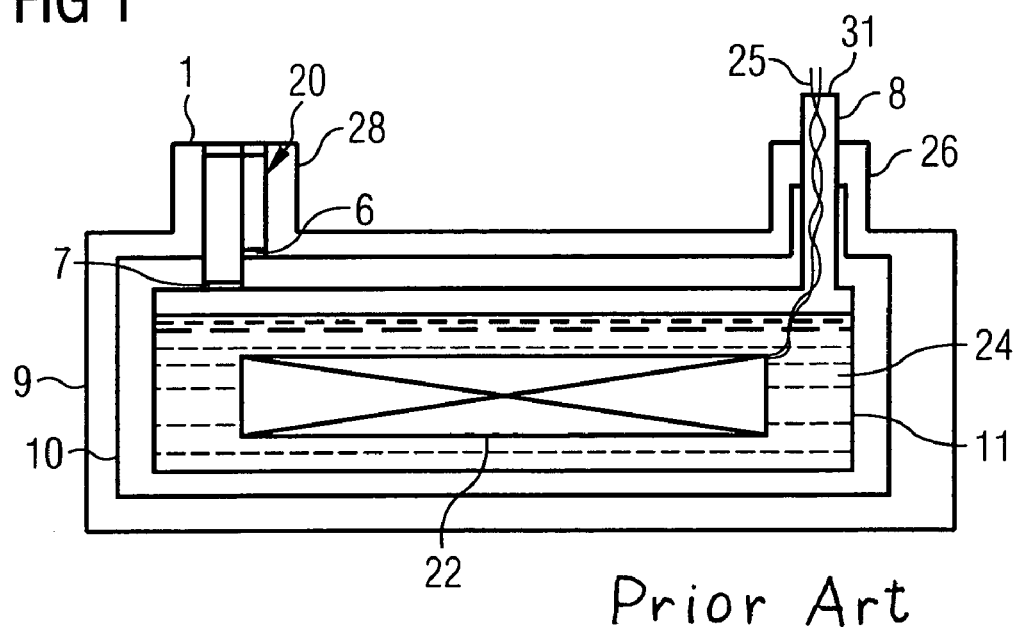

FIG. 1 is a rather schematic illustration of a known type of cryogenic helium vessel used for retaining a superconductive magnet at cryogenic temperatures. A superconductive magnet 22 is immersed in a bath of liquid helium 24 within an inner container, inner cryogen vessel 11. An outer vacuum vessel 9 is provided, and a vacuum is created in the void between inner and outer containers 11, 9. One function of this vacuum is to prevent heat from the exterior of the assembly being carried to the helium vessel by convection of gas within the void. A further container, cryostat radiation shield 10 is provided, between the inner cryogen vessel 11 and the outer vessel 9. One function of this radiation shield is to prevent heat from the exterior from reaching the cryogen vessel 11 by radiation.

A neck tube 8 is provided, which provides external access to the cryogen vessel 11 through the radiation shield 10 and the outer vacuum vessel 9. This neck tube 8 allows access to the cryogen vessel 11 for refilling, and also allows electrical current leads 25 to be provided to the magnet 22 from the exterior. The neck tube is usually sealed, but needs to be able to provide an escape path for helium gas in the case of a quench. In some examples, the neck tube 8 is sealed with a bursting disk 31. In the case of a quench, the pressure inside the helium vessel rises, until it becomes sufficient to dislodge, or rupture, the bursting disk 31, allowing helium gas to escape from the helium vessel 11.

A refrigerator 20 is provided. In some known systems, this refrigerator is a two-stage pulse tube refrigerator. A first stage 6 cools the radiation shield 10 to a first cryogenic temperature, while the second stage 7 cools the helium vessel 11 to a second, lower, cryogenic temperature below the boiling point of helium, causing the helium in helium vessel 11 to become, or remain, liquid. Liquid helium cooling and recondensation is achieved by having refrigerator cooling stages exposed to the helium atmosphere by welding into the helium vessel 11.

As can be seen in FIG. 1, this known arrangement requires two turrets 26, 28. The first turret 26 provides a housing for the neck tube 8, while the second turret 28 provides a housing for the pulse tube refrigerator 20. This implementation has several drawbacks. Among them is, firstly, the need to provide two turrets causes increased manufacturing costs. The neck tube 8 provides a thermal path for heat to reach the cryogen vessel 11 from the exterior. The refrigerator 20 is intended to remove this heat, but is not particularly efficient, as the neck tube is located some distance away from the refrigerator. Leakage of heat into the system is relatively high, due to the presence of two turrets.

Figure 2:
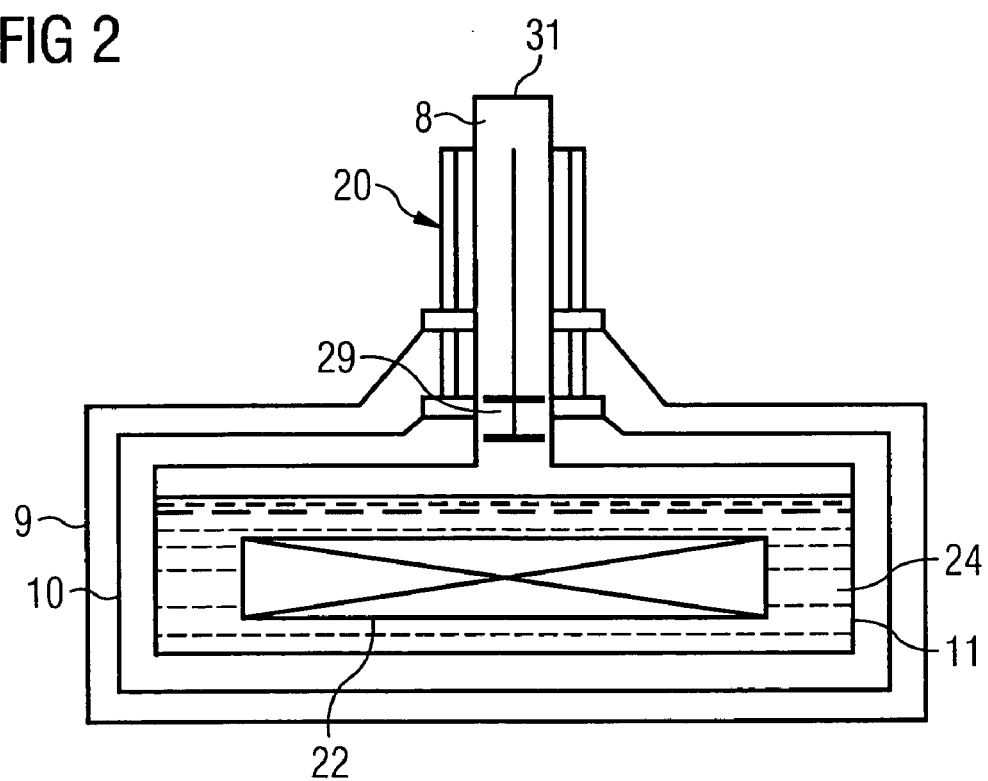

FIG. 2 illustrates an alternative, known, implementation. Such implementation is discussed, for example, in UK Patent No. GB2330194. In this implementation, a pulse tube refrigerator 20 and neck tube 8 are designed to fit within a single turret, by arranging the refrigerator concentrically around the neck tube. This removes the problems which stem from the refrigerator being separated from the neck tube, and improves the refrigerator's ability to remove any heat which enters the assembly by means of the neck tube, before the heat reaches the helium vessel 11. A baffle 29 is provided, to dampen oscillations of gas in the neck tube. A bursting disk 31 is provided, as discussed earlier.

However, the arrangement shown in FIG. 2 also suffers from certain drawbacks. Since the single turret must accommodate both the neck tube 8 and the refrigerator 20, the turret must be relatively large. The heat influx through the neck increases accordingly.

In a further known implementation (not illustrated), an enlarged neck tube 8 may be provided. In this case, the pulse tube refrigerator 20 is placed within the neck tube. This implementation suffers from the problem of increased parasitic heat influx, leading to greater refrigeration requirements as discussed above with regard to the example shown in FIG. 2. Furthermore, since the pulse tube refrigerator is placed within the neck tube, it is exposed to the liquid helium 24. In the case of a quench, a significant volume of helium gas at approximately its boiling point will escape through the neck tube, potentially causing thermal and mechanical shock to the pulse tube refrigerator.

The present invention accordingly addresses the drawbacks of the known arrangements, and provides an improved cryogenic tank with pulse tube refrigerator.

The present invention provides a pulse tube refrigerator (PTR) integrated with a bath cryostat containing liquid cryogen and a superconductive magnet. Specifically it shows how the cryogen gas venting is handled and arranged in relation to the refrigeration—in particular the arrangement of refrigerator, gas vent and current leads, and the relative size of the gas vent. In the present invention, the gas vent size is minimised for efficient cryogenic design.

Accordingly, the invention provides an improved cryogenic chamber with pulse tube refrigerator. The cryogenic chamber comprises an outer vacuum vessel, an inner cryogen vessel, a turret housing a neck tube itself providing external access to the inner cryogen vessel, and a pulse tube refrigerator, wherein the pulse tube refrigerator is located within a vacuum contained between the outer vacuum vessel and the inner cryogen vessel and the pulse tube refrigerator and the neck tube share a single turret. The cooling stage(s) of the pulse tube refrigerator is/are connected to the neck tube by highly conductive thermal links made by direct welding or construction of refrigerator stages into the respective vessel(s). The pulse tube(s) and regenerator tube(s) are displaced away from the neck tube and from each other.

More particularly, the present invention provides a cryogenic chamber comprising an outer vacuum vessel, an inner cryogen vessel, a turret housing a neck tube itself providing external access to the inner cryogen vessel, and a pulse tube refrigerator itself comprising at least one pulse tube and at least one regenerator tube. The pulse tube refrigerator is located within a vacuum contained between the outer vacuum vessel and the inner cryogen vessel and the pulse tube refrigerator and the neck tube share a single turret. The cooling stage(s) of the pulse tube refrigerator is/are rigidly mechanically connected to the neck tube by highly conductive thermal links, the pulse tube(s) and regenerator tube(s) being displaced away from the neck tube and from each other.

The present invention also provides a prefabricated assembly for incorporation into a cryogenic chamber, comprising a neck tube and a pulse tube refrigerator itself comprising at least one pulse tube and at least one regenerator tube. The cooling stage(s) of the pulse tube refrigerator is/are rigidly mechanically connected to the neck tube by highly conductive thermal links, the pulse tube(s) and regenerator tube(s) being displaced away from the neck tube and from each other.

The neck tube may be thermally connected to all three of the following points:

to the high temperature end of the pulse tubes;
to low temperature end of the first pulse tube; and
to the second stage pulse tube and the inner cryogen vessel.

At each of the three points, a permanent highly thermally conductive link may be provided between the neck tube and the relevant point.

The links may form parts of the cooling stages of the refrigerator. The links may be made of copper.

The diameter of the neck tube may be reduced in size to a size sufficient only to provide access for cryogen fill, current leads and other services, and to allow safe venting of cryogen in the case of a quench.

The cooling stage(s) of the pulse tube refrigerator may be rigidly mechanically connected to the neck tube by at least one of: welding; soldering; brazing and clamping.

The cryogenic chamber may further comprise a radiation shield interposed between the outer vacuum vessel and the inner cryogen vessel. The cooling stage(s) of the pulse tube refrigerator may be connected to the inner cryogen vessel and the radiation shield by the highly conductive thermal links.

The pulse tube refrigerator may be a two-stage refrigerator, with a high temperature end of a first stage pulse tube connected to the outer vacuum vessel, a low temperature end of the first stage pulse tube connected to the radiation shield and a first stage regenerator tube connected between the outer vessel and the radiation shield.

A high temperature end of a second stage pulse tube may be connected to the outer vacuum vessel; a low temperature end of the second stage pulse tube may be connected to the inner cryogen vessel; and a second stage regenerator tube may be connected between the radiation shield at the first low temperature end and the inner cryogen vessel at the second low temperature end.

The neck tube may be thermally connected to all three of the following points:

to the outer vacuum vessel and the high temperature end of the pulse tubes;
to the radiation shield and the low temperature end of the first pulse tube; and
to the low temperature end of the second stage pulse tube and the inner cryogen vessel.

A permanent highly thermally conductive link may be provided between the neck tube and the relevant point. The links may form parts of the cooling stages of the refrigerator. The links may be made of copper.

The second cold end may be part of the cryogen vessel, and a lower part of the neck tube may be used as a second stage liquefaction surface.

Figure 3:
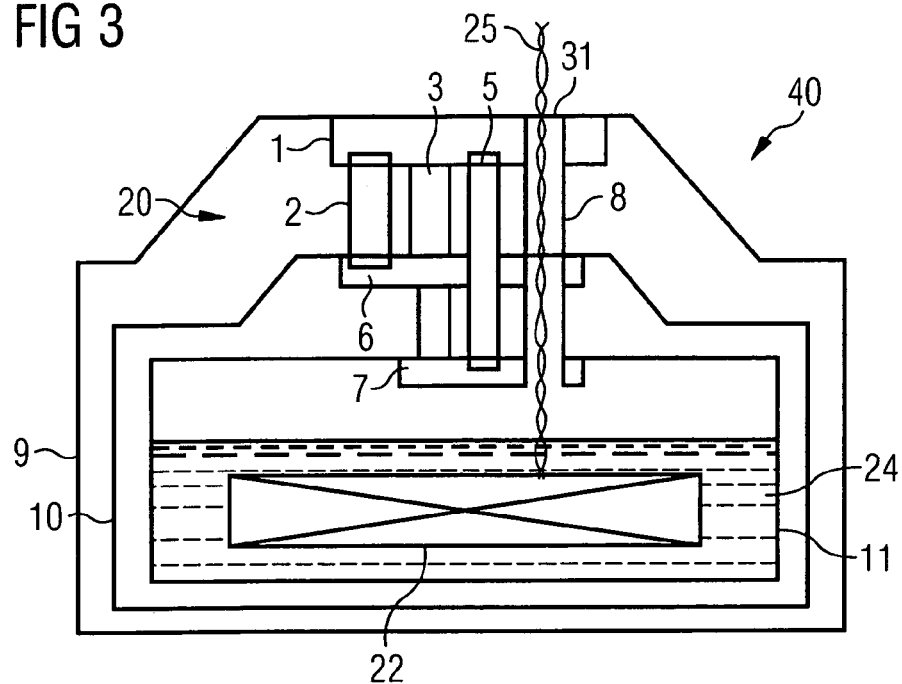
Figure 4:
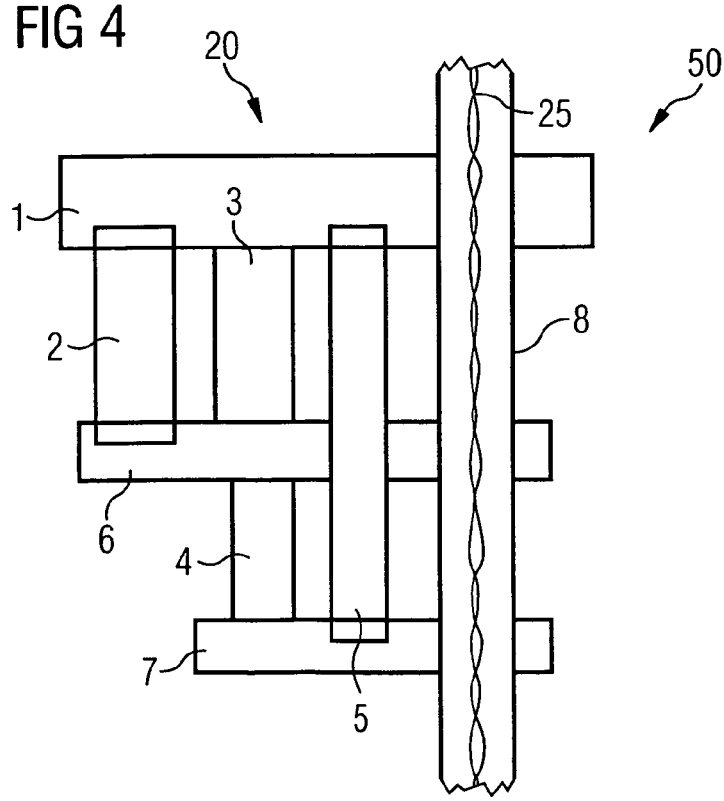

The above, and further, aims, characteristics and advantages of the present invention will become more apparent with reference to the following description of certain embodiments thereof, taken in conjunction with the appended drawings, wherein:

FIG. 1 schematically shows a cryogenic chamber according to the prior art;

FIG. 2 schematically shows a cryogenic chamber according to a further example of the prior art; and FIG. 3 schematically shows a cryogenic chamber according to the present invention; and FIG. 4 shows an enlarged schematic representation of a prefabricated assembly of a refrigerator and neck tube, as shown in FIG. 3, according to an aspect of the present invention.

FIG. 3 shows a cryogenic chamber according to an embodiment of the present invention. According to an aspect of the present invention, the pulse tube refrigerator 20 is enclosed within the vacuum space between the helium vessel 11 and the outer vacuum vessel 9, while the pulse tube refrigerator and the helium neck 8 share a single turret 40. The relative width of the turret 40 is exaggerated in FIG. 3 for clarity. Although the pulse tube refrigerator 20 shares the same turret as the helium neck 8, it is not placed within the helium neck tube. Rather, the pulse tube refrigerator is connected 1, 6, 7 externally to the helium neck tube. This enables a smaller diameter neck tube 8 to be used, reducing the rate of parasitic influx of heat towards the helium vessel 11. Furthermore, the pulse tube refrigerator 20 cools the helium neck tube 8, virtually eliminating helium boil-off under normal operating conditions. The pulse tube refrigerator 20 is enclosed within the vacuum volume between the outer vessel 9 and the helium vessel 11. This vacuum provides thermal insulation of the refrigerator, and also provides thermal insulation between the various components of the refrigerator, which are displaced away from the neck tube, and each other. The pulse tube refrigerator 20 and the neck tube 8 share a single turret 40. The cooling stage(s) of the pulse tube refrigerator 20 is/are connected to the neck tube 8 by highly conductive thermal links 6, 7. These links may be formed by processes such as welding, brazing, soldering or mechanical clamping. The joints are mechanically rigid, and the joints to the helium vessel 11 and the outer vacuum vessel 9 are vacuum tight.

The pulse tube refrigerator 20 shown in the illustrated embodiment is a two-stage refrigerator. The arrangement of the refrigerator and the helium neck tube according to this embodiment of the invention may be viewed more clearly by reference to FIG. 4.

FIG. 4 shows an assembly 50 of neck tube 8, pulse tube refrigerator 20 and thermal links at heat stages 6, 7 and at the warm end 1. This assembly may be prefabricated for on-site installation into a cryogenic chamber, as will be discussed in more detail below.

The high temperature ("warm") end 1 of the first stage pulse tube 2 is connected to the outer vacuum vessel 9, which accordingly acts both as a mechanical mounting point, and a thermal reference point. The low temperature end 6 of the first stage pulse tube 2 is connected to the radiation shield 10, which is typically held at a temperature intermediate between the temperature of the outer vacuum vessel 9 and that of the helium vessel 11. First stage regenerator tube 3 is also connected between the outer vessel 9 at high temperature end 1 and the radiation shield 10 at low temperature end 6.

The high temperature end 1 of the second stage pulse tube 5 is connected to the outer vacuum vessel 9, which accordingly acts both as a mechanical mounting point, and a thermal reference point. The low temperature end 7 of the second stage pulse tube 5 is connected to the helium vessel 11. Second stage regenerator tube 4 is connected between the radiation shield 10 at the first low temperature end 6 and the helium vessel 11 at the second stage low temperature end 7.

The helium neck tube 8 is connected to all three of these points: to the outer vacuum vessel 9 and the high temperature end 1 of the pulse tubes; to the radiation shield 10 and the low temperature end 6 of the first pulse tube; and to the low temperature end 7 of the second stage pulse tube and the helium vessel.

In each of the preceding three paragraphs, references to connections or connected features preferably comprises mechanically rigid, thermally conductive links made by processes such as welding, brazing, soldering or clamping, thereby minimising the need for large amounts of conduction (transport of heat) for cooling, as the stages are then already in intimate contact with the required cooling surfaces. At each of these locations, a permanent highly thermally conductive link 1, 6, 7, preferably of a metal, is provided between the neck tube 8 and the relevant point within the pulse tube refrigerator 20. The links should be in good thermal contact both with the neck tube and the relevant part of the pulse tube refrigerator. Preferably, these links are made of copper. Preferably, the links are welded, brazed, soldered or clamped as appropriate to the helium neck tube 8 at the respective location.

Since the low temperature end 7 of the second stage forms part of the helium vessel 11, re-condensation of evaporated helium will occur here. This will reduce the quantity of helium gas 110 escaping through the helium neck tube 8, and also ensures that there is no boil-off of the helium from the helium vessel 11 due to parasitic heat influx through the neck tube 8.

An advantage of the invention and of the embodiment illustrated in FIGS. 3–4 is that the helium neck tube 8 is a relatively narrow tube which is attached to the pulse tube refrigerator. The size of the neck tube 8 may be reduced since the pulse tube refrigerator 20 is not housed within the tube 8, and the tube 8 may be reduced in size to a size sufficient only to provide access for helium fill, current leads 25 and other services, and to allow safe venting of helium in the case of a quench. The smaller diameter of the tube 8 minimises parasitic heat loads on the system, allowing a smaller pulse tube refrigerator to be used, and simplifies the arrangement. Use of a smaller pulse tube refrigerator results in lower overall cost and physical size of the system.

A further advantage is in that the pulse tube refrigerator 20 is fitted in the cryostat vacuum space, that is, between the outer, vacuum, vessel 9 and the inner helium vessel 11. If the pulse tube refrigerator were placed in the neck tube 8, as in the prior art, additional material would be required to separate the pulse tubes 2, 5 from gas that would be present in a larger neck tube 8. This additional material is not required in the arrangement of the present invention, providing at least the advantages of reduced cost and compact design.

As the pulse tube refrigerator is placed within the main vacuum, a high quality vacuum insulation is provided.

At the cold end 7 of the second stage, recondensation of helium will occur on all surfaces exposed to helium. This cold end 7 is preferably part of the helium vessel 11. The lower part of the neck tube 8 may be specifically designed and used as the second stage liquefaction surface.

The structure of the invention has many benefits.

By placing the pulse tube refrigerator outside of the neck tube, yet still in intimate thermal and mechanical contact with the neck tube, the problem of the prior art whereby the pulse tube refrigerator is cooled during a quench to an extremely low temperature, such as 10K, and possibly thereby damaged, is avoided.

The cooling stages 6, 7 and the warm end 1 are typically made of thick thermally conductive material, such as solid copper. The neck tube 8 is typically made of a thin walled material such as aluminium. At least at the outer container 9 and the inner vessel 11, the joint with the cooling stages or the warm end must be vacuum tight, such as a joint made by vacuum brazing, welding or soldering. As is well known in the art, in such circumstances, it is difficult to provide enough heat to heat the thick material to a sufficiently high temperature without damaging the thin walled vessel. This is particularly true when attempting to make such a join in a confined space with difficult access.

The present invention allows the assembly 50 shown in FIG. 4 and comprising the cooling stages and warm end 1, 6, 7, the refrigerator 2,3,4,5 and the neck tube 8 to be assembled into one unit separate from the whole magnet structure 4. The assembly 50 may accordingly be prefabricated in an environment specially chosen to facilitate assembly. For example, vacuum brazing may be used to join the neck tube 8 to some or all of the cooling stages and warm end, by constructing the assembly in a vacuum chamber. Such process would be impossible to achieve, at least due to size considerations, if the assembly 50 were constructed directly into the whole structure of the cryogenic chamber 40.

When such a prefabricated assembly is assembled into the cryogenic chamber 40, the following procedure may be adopted. The outer container 9 and the shield 10 are initially devoid of the tower structure. The coldest cooling stage 7 is attached to the cryogen vessel 11 in a vacuum-tight manner, for example by welding, soldering or brazing. The heat stage 7 of the assembly 50 is attached into a dedicated hole in the cryogen vessel. As the neck-tube 8 is already sealed to the cooling stage 7 in a vacuum tight manner, it is not necessary to perform a separate attachment process such as welding brazing or soldering to attach the neck tube 8 to the cryogen vessel 7. This would be a difficult and inconvenient procedure, and is avoided by the present invention.

The turret portion of heat shield 10 may then be attached to the remaining part of the heat shield, for example by welding, soldering or brazing. This joint need not be vacuum tight, as the joint is exposed to a vacuum on either side. The cooling stage 6 of the assembly 50 is attached into a dedicated hole in the turret portion of the heat shield 10. As the neck tube is already incorporated into the assembly 50 and joined to the cooling stage 6, no separate process is required for joining the neck tube to the heat shield 10.

The turret portion of the outer vacuum vessel 9 may then be attached to the remainder of the outer container, for example by welding, brazing or soldering. The warm end cooling stage 1 is thermally and mechanically attached into a dedicated hole in the outer vacuum vessel 9 in a vacuum tight manner, for example by welding, soldering or brazing. As the neck tube is already incorporated into the assembly 50 and joined to the warm end cooling stage 1, no separate process is required for joining the neck tube to the outer container 9. The mechanical and thermal connection of the warm end 1 to the neck tube 8 is not required for any functional reason, but facilitates assembly, as described.

The cooling stages and warm end are preferably circular to simplify assembly of the cryogenic chamber.

Assembly of the cryogenic chamber is accordingly simplified, and the vacuum seals made more reliable in that fewer joints need to be made in situ. Only three relatively simple, preferably circular, welds need to be made to join the entire assembly of refrigerator, heat stations and neck tube into the cryogenic chamber, that is to say, once for each heat stage or warm end. This represents a marked reduction to the complexity of on-site assembly as compared with prior art solutions. The joints required to attach the turret portions in place are required for all types of assembly.

In known assemblies, each of the cryogen vessel 11, the heat shield 10 and the outer vacuum vessel 9 had at least two holes—one to hold the refrigerator, one to hold the neck tube. Each of these holes needs to be sealed by joining to the relevant part of the refrigerator or neck tube. The present invention significantly reduces the number of holes required, and the number of on-site joints to be made.

Some prior art solutions provide a flexible thermal link, such as copper braid, between the cooling stages of the refrigerator and the cryogen vessel, heat shield and outer vacuum vessel. In such solutions, a separate mechanical support is required for holding the refrigerator in place. According to certain embodiments of the present invention, the refrigerator may be mechanically self-supporting, relying on the cooling stages and warm end being mechanically rigidly connected to the vessels and heat shield. This feature also simplifies assembly of the cryogenic chamber.

According to certain aspects of the present invention, the pulse tubes and regenerator tubes of the refrigerator are all displaced away from each other, and from the neck tube. This provides certain advantages over prior art solutions in which the pulse tubes and neck tubes are in direct thermal communication with each other, and possibly also with the neck tube. In operation, each of the component parts—neck tubes, pulse tubes, cooling stages—will reach its own operational temperature profile. Operation of the refrigerator is most efficient if each component is allowed to operate with its own temperature profile. By placing the components in thermal contact with each other, possibly also with the neck tube 8, the thermal profiles would be altered by interaction between the various parts. Operation will be sub-optimal, and efficiency of refrigeration will reduce. The present invention provides an assembly in which the pulse tubes and refrigerator tube are all displaced away from each other along their lengths, allowing each one to develop and retain its own independent temperature profile, thereby enabling increased efficiency of refrigeration. The pulse tubes and regenerator tubes are preferably spaced away from each other and from the neck tube, providing effective vacuum insulation between the various components. The cooling stages are interconnected only by the neck tube, which is typically of very thin metal, and does not provide a significant heat conduction path between cooling stages.

The connections between each cooling stage or warm end and the neck tube may be made in a number of different ways. The essential properties of the connections are firstly, that the connection must be mechanically rigid. The connections to the warm end 1 and the cooling stage 7, which will be in contact with the cryogen vessel 11, must be vacuum tight. The connections to the cooling stages other than the warm end must provide good thermal conductivity between the neck tube and the cooling stage. Suitable connection methods for at least some of these connections include welding, brazing, vacuum brazing, and mechanical clamping. The connection method employed should not require penetration of the wall of the neck tube.

Although the present invention has been described with reference to a limited number of specific embodiments, the present invention may be applied to numerous similar situations. For example, although the description has consistently referred to liquid helium as the cryogen within the inner cryogen vessel 11, and various other components have been described as 'helium' components, any other known cryogen may be used, such as nitrogen for example, according to the nature of the equipment placed in the vessel 11, and such descriptions are to be interpreted accordingly. The present invention may be applied to equipment of shapes and configurations other than those described and illustrated. The present invention may be applied to such as cryostatic coolers for superconducting magnets used for magneto-resonance imaging (MRI) or nuclear magnetic resonance (NMR) imaging.

The invention claimed is:

1. A cryogenic chamber comprising:
   an outer vacuum vessel;
   an inner cryogen vessel;
   a turret housing a neck tube that provides external access to the inner cryogen vessel; and
   a pulse tube refrigerator which includes at least one pulse tube and at least one regenerator tube; wherein,
   the pulse tube refrigerator is located within a vacuum contained between the outer vacuum vessel and the inner cryogen vessel;
   the pulse tube refrigerator and the neck tube share a single turret;
   at least one cooling stage of the pulse tube refrigerator is rigidly mechanically connected to the neck tube by highly conductive thermal links; and
   the at least one pulse tube and the at least one regenerator tube are displaced away from the neck tube and from each other.

2. A prefabricated assembly for incorporation into a cryogenic chamber, comprising:
   a neck tube; and
   a pulse tube refrigerator that includes at least one pulse tube and at least one regenerator tube; wherein
   at least one, cooling stage of the pulse tube refrigerator is rigidly mechanically connected to the neck tube by highly conductive thermal links; and
   the at least one pulse tube and at least one regenerator tube are displaced away from the neck tube and from each other.

3. An assembly according to claim 2, wherein the pulse tube refrigerator comprises first and second pulse tubes, and wherein the neck tube is thermally connected to all three of the following points:
   a high temperature end of the pulse tubes;
   a low temperature end of the first pulse tube; and
   a low temperature end of the second pulse tube and the inner cryogen vessel.

4. An assembly according to claim 3, wherein at each of the three points, a permanent highly thermally conductive link is provided between the neck tube and the relevant point.

5. An assembly according to claim 2, wherein the links form parts of cooling stages of the refrigerator.

6. An assembly according to claim 5 wherein the links are made of copper.

7. An assembly according to claim 2, wherein the neck tube has a diameter that is sufficient only to provide access for cryogen fill, current leads and other services, and to allow safe venting of cryogen in the case of a quench.

8. A cryogenic chamber or assembly according to claim 1, wherein the at least one cooling stage of the pulse tube refrigerator is rigidly mechanically connected to the neck tube by at least one of: welding; soldering; brazing and clamping.

9. A cryogenic chamber according to claim 1, further comprising a radiation shield interposed between the outer vacuum vessel and the inner cryogen vessel.

10. A cryogenic chamber according to claim 9 wherein cooling stage(s) of the pulse tube refrigerator are connected to the inner cryogen vessel and the radiation shield by the highly conductive thermal links.

11. A cryogenic chamber according to claim 9, wherein:
the pulse tube refrigerator is a two-stage refrigerator;
a high temperature end of a first stage pulse tube is connected to the outer vacuum vessel;
a low temperature end of the first stage pulse tube is connected to the radiation shield; and
a first stage regenerator tube is connected between the outer vessel and the radiation shield.

12. A cryogenic chamber according to claim 11 wherein:
a high temperature end of a second stage pulse tube is connected to the outer vacuum vessel;
a low temperature end of the second stage pulse tube is connected to the inner cryogen vessel; and
a second stage regenerator tube is connected between the radiation shield at a first low temperature end and the inner cryogen vessel at a second low temperature end.

13. A cryogenic chamber according to claim 9, wherein the pulse tube refrigerator comprises first and second pulse tubes, and wherein the neck tube is thermally connected to all three of the following points:
the outer vacuum vessel and a high temperature end of the pulse tubes;
the radiation shield and a low temperature end of the first pulse tube; and
a low temperature end of the second pulse tube and the inner cryogen vessel.

14. A cryogenic chamber according to claim 13, wherein at each of the three points, a permanent highly thermally conductive link is provided between the neck tube and the relevant point.

15. A cryogenic chamber according to claim 1, wherein the links form parts of cooling stages of the refrigerator.

16. A cryogenic chamber according claim 15 wherein the links are made of copper.

17. A cryogenic chamber according to claim 1, wherein the diameter of the neck tube has a diameter that is sufficient only to provide access for cryogen fill, current leads and other services, and to allow safe venting of cryogen in the case of a quench.

18. A cryogenic chamber according to claim 12, wherein:
the cold end of the second stage is part of the cryogen vessel: and
a lower part of the neck tube is used as a second stage liquefaction surface.

* * * * *